(12) United States Patent
Imonigie et al.

(10) Patent No.: US 10,113,113 B2
(45) Date of Patent: *Oct. 30, 2018

(54) REMOVING POLYSILICON

(71) Applicant: MICRON TECHNOLOGY, INC., Boise, ID (US)

(72) Inventors: Jerome A. Imonigie, Boise, ID (US); Prashant Raghu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/590,593

(22) Filed: May 9, 2017

(65) Prior Publication Data

US 2017/0243758 A1 Aug. 24, 2017

Related U.S. Application Data

(60) Continuation of application No. 14/672,870, filed on Mar. 30, 2015, now Pat. No. 9,650,570, which is a division of application No. 13/624,272, filed on Sep. 21, 2012, now Pat. No. 9,012,318.

(51) Int. Cl.
| | |
|---|---|
| *C09K 13/08* | (2006.01) |
| *H01L 21/311* | (2006.01) |
| *C09K 13/00* | (2006.01) |
| *C09K 13/04* | (2006.01) |
| *C09K 13/06* | (2006.01) |
| *H01L 21/28* | (2006.01) |
| *H01L 27/11556* | (2017.01) |
| *H01L 21/3213* | (2006.01) |
| *H01L 21/306* | (2006.01) |

(52) U.S. Cl.
CPC .............. *C09K 13/08* (2013.01); *C09K 13/00* (2013.01); *C09K 13/04* (2013.01); *C09K 13/06* (2013.01); *H01L 21/28273* (2013.01); *H01L 21/30604* (2013.01); *H01L 21/31111* (2013.01); *H01L 21/32134* (2013.01); *H01L 27/11556* (2013.01)

(58) Field of Classification Search
None
See application file for complete search history.

(56) References Cited

U.S. PATENT DOCUMENTS

| | | | |
|---|---|---|---|
| 4,554,046 | A | 11/1985 | Taguchi et al. |
| 6,064,101 | A | 5/2000 | Krautschneider et al. |
| 7,211,484 | B2 | 5/2007 | Lee et al. |
| 7,413,969 | B2 | 8/2008 | Kim et al. |
| 2002/0028541 | A1 | 3/2002 | Lee et al. |
| 2002/0037654 | A1 | 3/2002 | Hayashi et al. |

(Continued)

OTHER PUBLICATIONS

An et al., "The Influence of NH4F on Silicon Etching in HF/HNO3/H2O System," Proceedings of the ISES Solar World Congress 2007: Solar Energy and Human Settlement, 2007, pp. 1051-1054.

(Continued)

*Primary Examiner* — Jiong-Ping Lu
(74) *Attorney, Agent, or Firm* — Dicke, Billig & Czaja, PLLC

(57) ABSTRACT

Methods include exposing polysilicon to an aqueous composition comprising nitric acid, poly-carboxylic acid and ammonium fluoride, and removing a portion of the polysilicon selective to an oxide using the aqueous composition.

10 Claims, 7 Drawing Sheets

(56) References Cited

U.S. PATENT DOCUMENTS

| | | |
|---|---|---|
| 2002/0127859 A1* | 9/2002 | Wu .................. H01L 21/02032 |
| | | 438/689 |
| 2004/0188385 A1 | 9/2004 | Yamada et al. |
| 2004/0242016 A1 | 12/2004 | Yates |
| 2004/0244823 A1 | 12/2004 | Kim et al. |
| 2005/0143270 A1* | 6/2005 | Wojtczak ............. C11D 7/3218 |
| | | 510/175 |
| 2008/0182392 A1 | 7/2008 | Yeh et al. |
| 2009/0246967 A1 | 10/2009 | Yaguchi et al. |
| 2011/0065276 A1 | 3/2011 | Ganguly et al. |
| 2011/0286283 A1 | 11/2011 | Lung et al. |
| 2012/0025282 A1 | 2/2012 | Doris et al. |
| 2012/0052671 A1 | 3/2012 | Seong et al. |
| 2013/0196497 A1 | 8/2013 | Shimada et al. |

OTHER PUBLICATIONS

Manea et al., "Silicon Solar Cells Parameters Optimization by Adequate Surface Processing Techniques," Romanian Journal of Information Science and Technology, vol. 11, No. 4, 2008, pp. 337-345.

\* cited by examiner

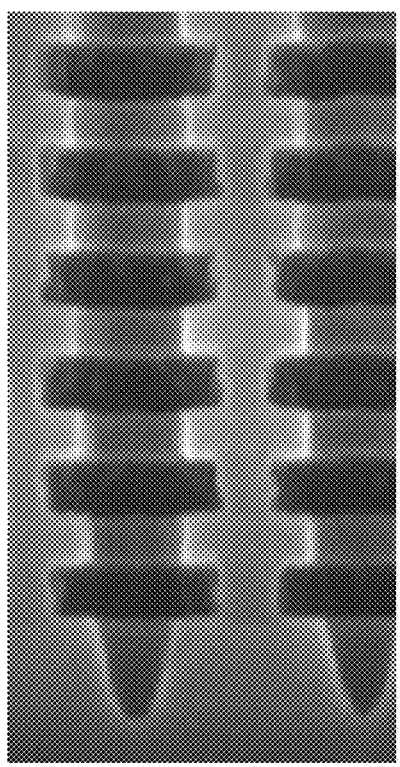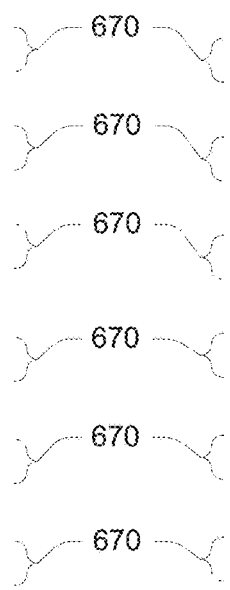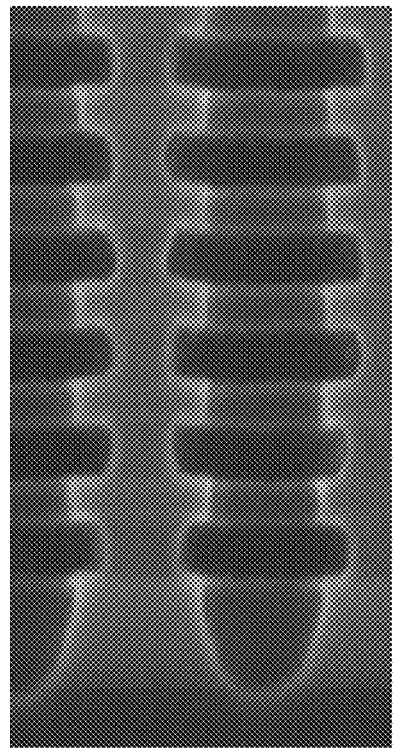
FIG. 6A
Prior Art
FIG. 6B

REMOVING POLYSILICON

RELATED APPLICATIONS

This Application is a Continuation of U.S. application Ser. No. 14/672,870, titled "COMPOSITIONS FOR ETCHING POLYSILICON," filed Mar. 30, 2015, now U.S. Pat. No. 9,650,570 issued on May 16, 2017, which is a Divisional of U.S. application Ser. No. 13/624,272, titled "ETCHING POLYSILICON," filed Sep. 21, 2012, now U.S. Pat. No. 9,012,318 issued on Apr. 21, 2015, which are commonly assigned and incorporated herein by reference.

TECHNICAL FIELD

The present disclosure relates generally to etching of polysilicon and, in particular, in one or more embodiments, the present disclosure relates to methods for recessing doped polysilicon in integrated circuit device structures, compositions used to perform such methods, and apparatus formed thereby.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of data-storage structures, using charge-storage structures (e.g., floating gates or charge traps) or other physical phenomena (e.g., phase change or polarization), determine the data state of each cell. Common uses for flash memory include personal computers, personal digital assistants (PDAs), digital cameras, digital media players, cellular telephones, solid state drives and removable memory modules, and the uses are growing.

There is a continuing desire to increase memory density, e.g., the number of bits of data that can be stored for a given integrated circuit die area. However, as memory density increases, the device structures often become smaller, and fabrication of these structures becomes more critical. For example, device structures are often formed by depositing layers of materials of different compositions, and selectively removing portions of these layers, such as by isotropic or anisotropic removal techniques. As these structures become smaller, selectivity of the removal technique, i.e., the ability to remove one material while maintaining the integrity of adjacent, dissimilar materials, becomes more important.

For the reasons stated above, and for other reasons stated below which will become apparent to those skilled in the art upon reading and understanding the present specification, there is a need in the art for alternative methods for facilitating improvements in formation of structures for integrated circuit devices.

BRIEF DESCRIPTION OF THE DRAWINGS

FIG. 6A is a SEM picture of a cross-sectional view of a structure of the type depicted in FIG. 3C formed in accordance with the prior art.

FIG. 6B is a SEM picture of a cross-sectional view of a structure of the type depicted in FIG. 3C formed in accordance with an embodiment.

DETAILED DESCRIPTION

Figure 1:
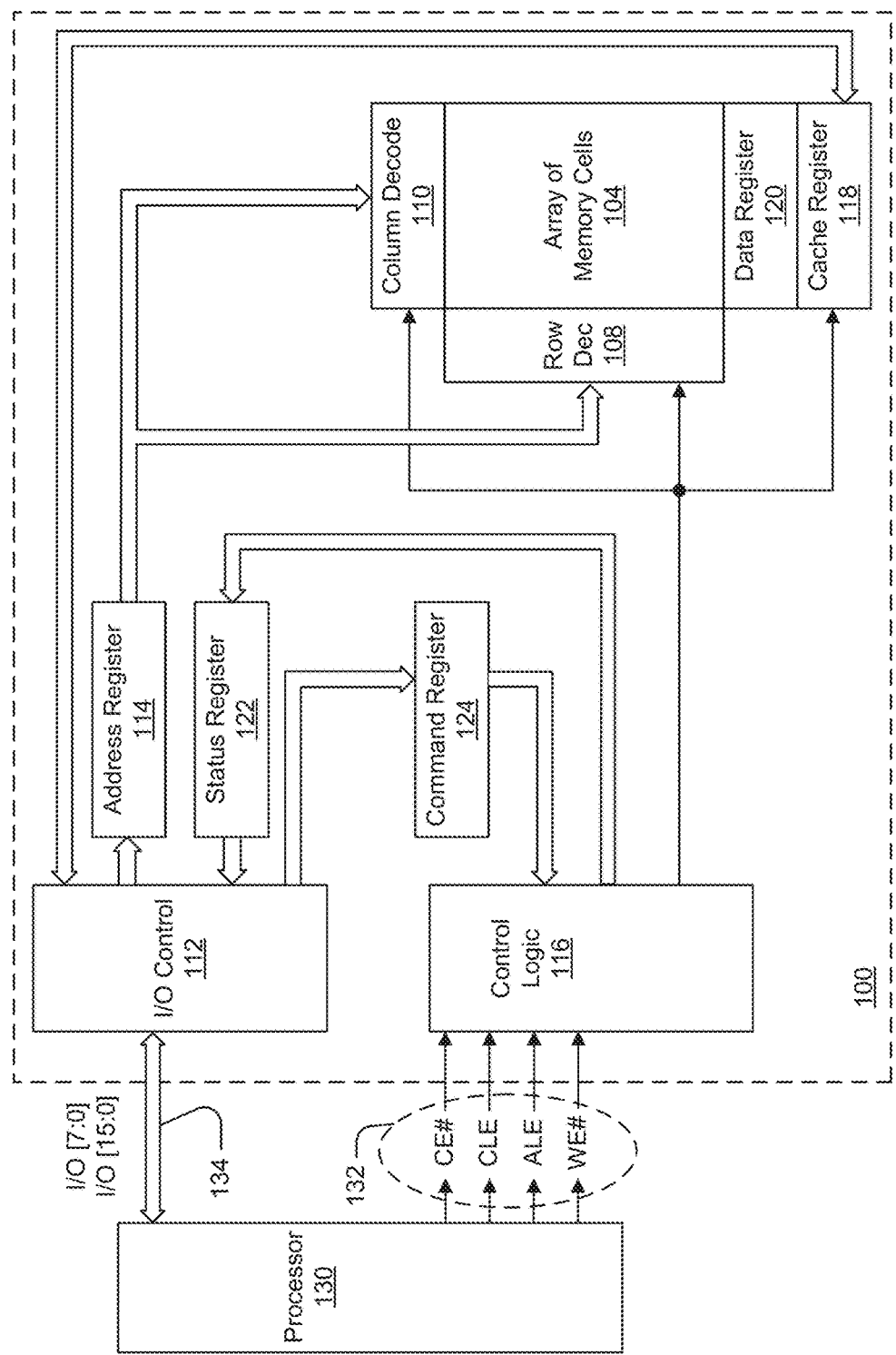
FIG. 1 is a simplified block diagram of a memory device in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical, chemical and electrical changes may be made without departing from the scope of the present disclosure. The following detailed description is, therefore, not to be taken in a limiting sense.

FIG. 1 is a simplified block diagram of a first apparatus in the form of a memory device 100 in communication with a second apparatus, in the form of a processor 130, as part of a third apparatus, in the form of an electronic system, according to an embodiment. Some examples of electronic systems include computer servers, network devices, personal computers, personal digital assistants (PDAs), digital cameras, digital media players, digital recorders, games, appliances, vehicles, wireless devices, cellular telephones and the like. The processor 130 may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are formed using methods as described herein.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

Control logic 116 controls access to the array of memory cells 104 in response to the commands and generates status information for the external processor 130. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a write operation, data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Status register 122 may include a ready/busy register. For example, a 1-bit register could be used to indicate whether the memory device 100 is busy (e.g., that the memory device 100 is performing an access operation) or ready (e.g., that the memory device 100 has completed, or is not performing, an access operation). Thus, reading the status register 122, such as by the processor 130 or the control logic 116, could be used to determine whether the memory device 100 is involved in an access operation or not, e.g., whether or not the memory device is ready to initiate an access operation. Alternatively, or in addition, the control logic 116 of memory device 100 might provide a ready/busy (R/B#) signal to provide an indication to processor 130 of whether or not the memory device 100 is involved in an access operation. For example, memory devices often provide a pin (e.g., a pin of control link 132) that is asserted to a logic low, for example, when the device is involved in an access operation and is pulled up to a logic high when the device is again available (e.g., not involved in an access operation).

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received or provided over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data, e.g., from the array of memory cells 104 or the status register 122, are also output over input/output (I/O) pins [7:0] for an 8-bit device or input/output (I/O) pins [15:0] for a 16-bit device.

It will be appreciated by those skilled in the art that additional circuitry and signals can be provided, and that the electronic system of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O and command pins are described in accordance with popular conventions for receipt and output of the various signals, it is noted that other combinations or numbers of pins may be used in various embodiments.

Figure 2:
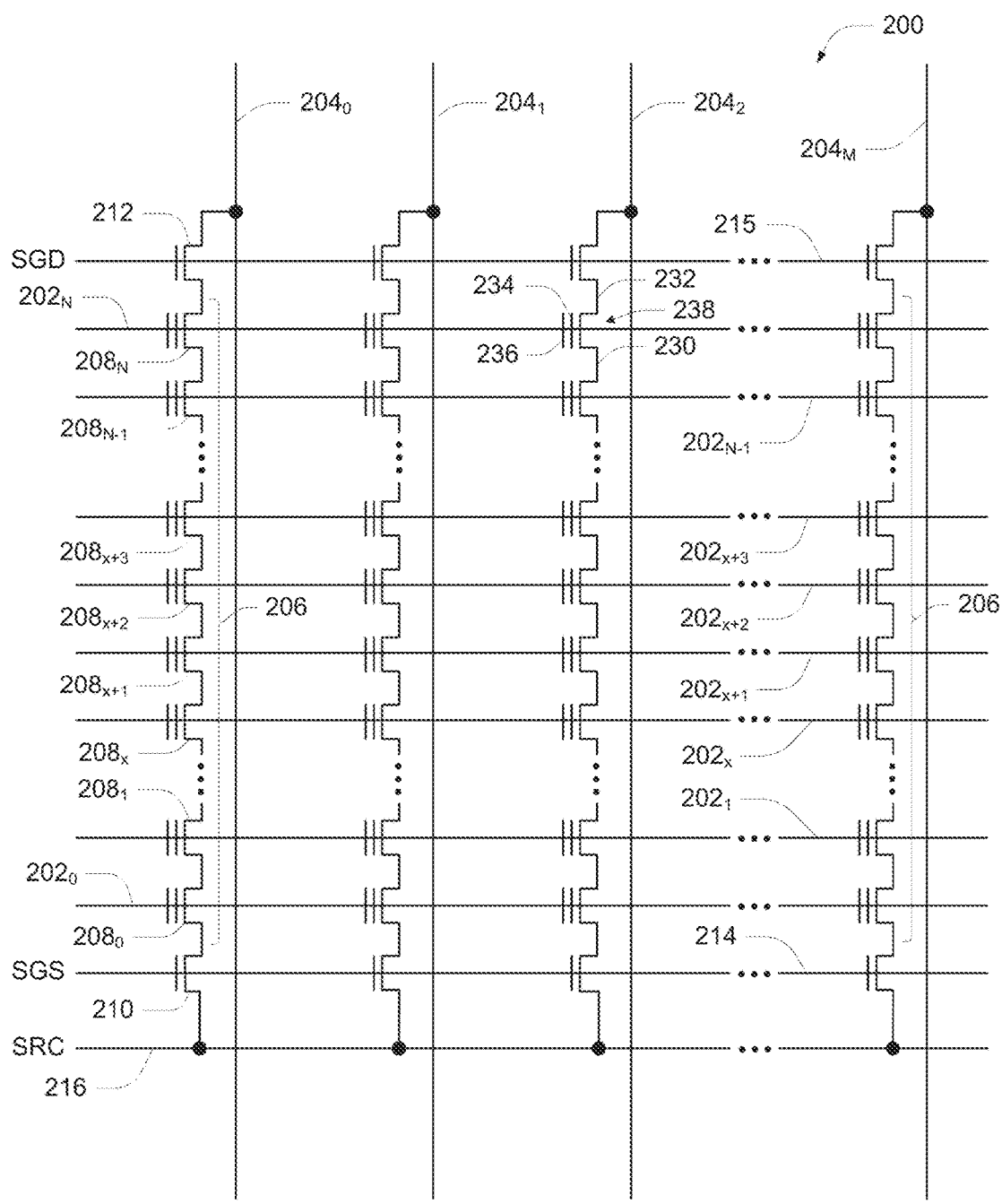
FIG. 2 is a schematic of an array of memory cells in accordance with an embodiment.

FIG. 2 is a schematic of an array of memory cells 200, e.g., as a portion of the array of memory cells 104, in accordance with an embodiment. Array of memory cells 200 includes access lines, such as word lines $202_0$ to $202_N$, and intersecting data lines, such as bit lines $204_0$ to $204_M$. For ease of addressing in the digital environment, the number of word lines 202 and the number of bit lines 204 are generally each some power of two, e.g., 256 word lines 202 by 4,096 bit lines 204.

Array of memory cells 200 is arranged in rows (each corresponding to a word line 202) and columns (each corresponding to a bit line 204). Each column may include a string of memory cells 208, such as one of the NAND strings 206. Each NAND string 206 may be coupled to a common source (SRC) 216 and includes memory cells $208_0$ to $208_N$, each located at an intersection of a word line 202 and a bit line 204. The memory cells 208, depicted as floating-gate transistors in FIG. 2, represent non-volatile memory cells for storage of data. Memory cells 208 may be, for example, enhancement mode (e.g., n-type) transistors. The memory cells 208 of each NAND string 206 are connected in series, source to drain, between a source select line (SGS) 214 and a drain select line (SGD) 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212. Arrays of memory cells utilizing more than one select gate at one or both ends of a NAND string 206 are known. If multiple source select gates 210 are utilized for a given string of memory cells 206, they could be coupled in series between the common source 216 and the memory cell $208_0$ of that string of memory cells 206. If multiple drain select gates 212 are utilized for a given string of memory cells 206, they could be coupled in series between the corresponding bit line 204 and the memory cell $208_N$ of that string of memory cells 206.

A source of each source select gate 210 is connected to common source 216. The drain of each source select gate 210 is connected to the source of the memory cell 208 of a corresponding NAND string 206. Therefore, each source select gate 210 selectively couples its corresponding NAND string 206 to common source 216. A control gate of each source select gate 210 is connected to source select line 214.

The drain of each drain select gate 212 is connected to the bit line 204 for the corresponding NAND string 206. The source of each drain select gate 212 is connected to the drain of the last memory cell $208_N$ of its corresponding NAND string 206. Therefore, each drain select gate 212 selectively couples a corresponding NAND string 206 to a corresponding bit line 204. A control gate of each drain select gate 212 is connected to drain select line 215.

Typical construction of memory cells 208 includes a source 230 and a drain 232, a data-storage structure 234 (e.g., a floating gate, charge trap, etc.) that can determines a data state of the cell (e.g., through changes in threshold voltage), a control gate 236, and a body 238 (e.g., a semiconductor on which the memory cell 208 is formed), as shown in FIG. 2. Memory cells 208 have their control gates 236 coupled to (and in some cases from) a word line 202. A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one row of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another row of memory cells 208 (e.g., odd memory cells). Although bit lines $204_3$-$404_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a row of memory cells 208.

Figure 3A:
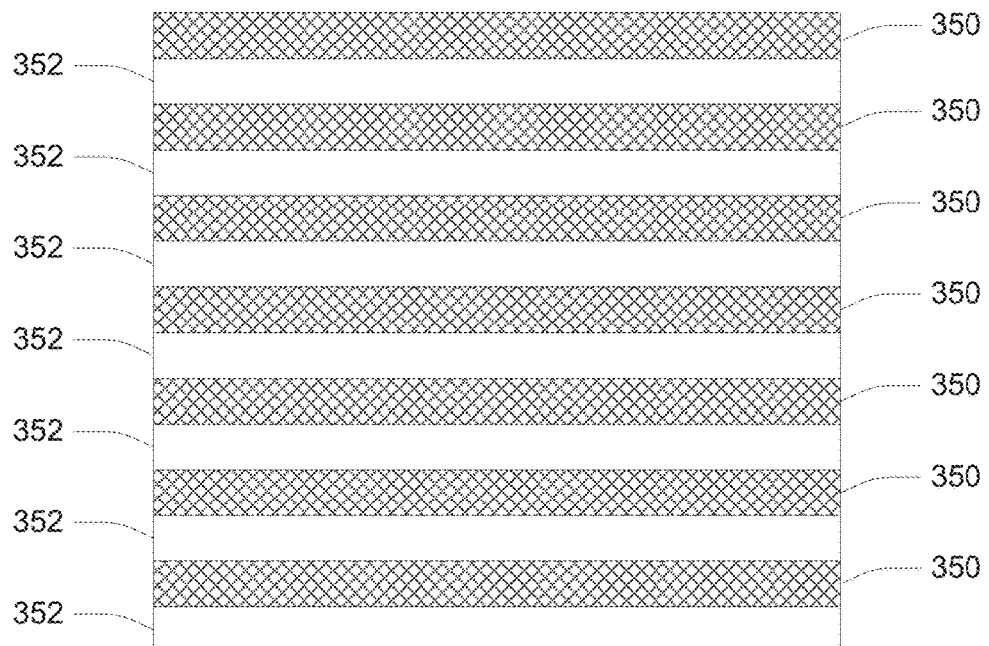
FIGS. 3A-3C are cross-sectional views of a portion of an integrated circuit device during various stages of fabrication in accordance with an embodiment.
Figure 3B:
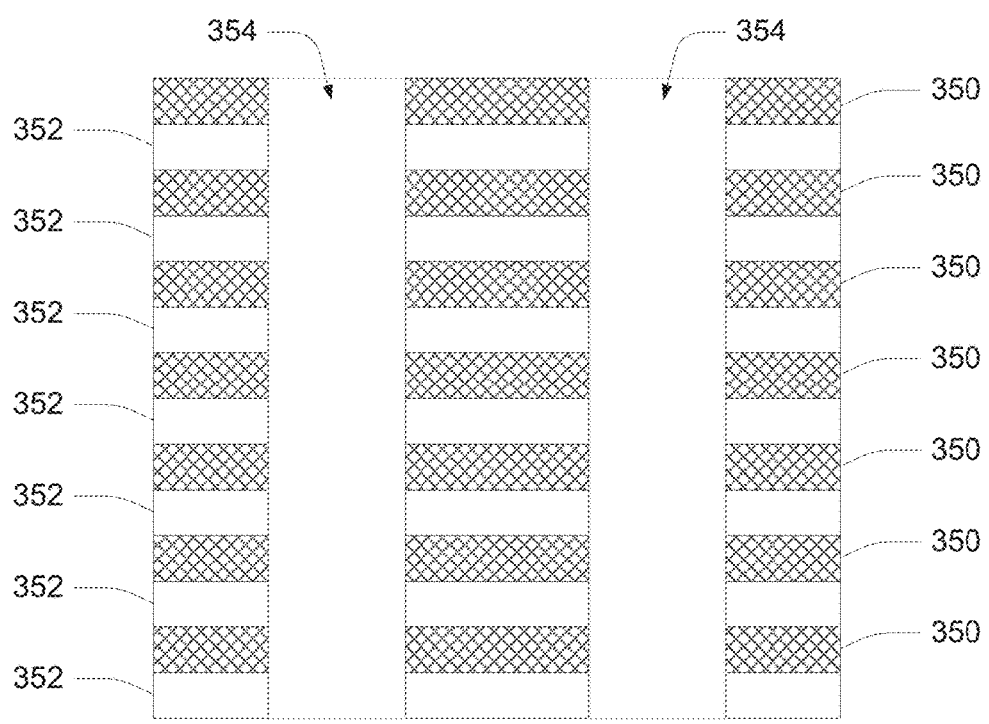
Figure 3C:
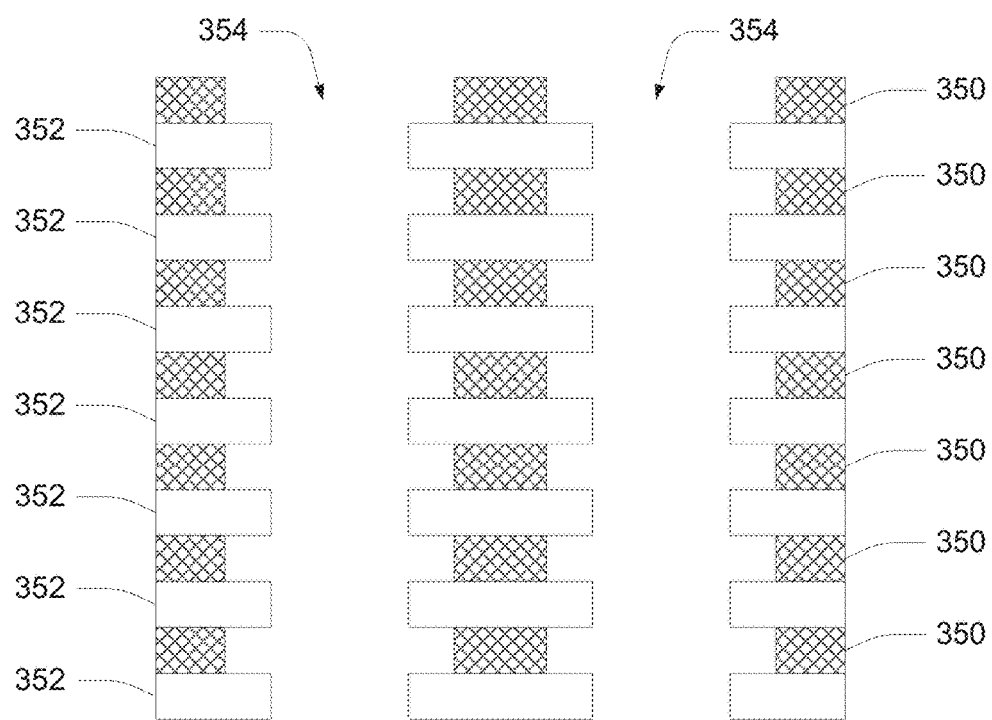

FIGS. 3A-3C are cross-sectional views of a portion of an integrated circuit device during various stages of fabrication. The structure of FIG. 3A depicts a stack of dissimilar materials 350 and 352. For one embodiment, the material 350 is polysilicon 350, e.g., a boron-doped polysilicon, while the material 352 is an oxide 352, e.g., such as a silicon oxide ($SiO/SiO_2$) or silicon oxynitride ($SiO_xN_y$) material. Such materials may be doped or undoped.

For one example, instances of material 350 may be used to form control gates of memory cells, such as control gates 236 of memory cells 208 of NAND strings 206 of FIG. 2. Similarly, instances of material 352 may be used to provide isolation between adjacent memory cells 208, such as between memory cells $208_0$ and $208_1$ of FIG. 2. Formation of the structure of FIG. 3A could be formed by forming (e.g., depositing) an instance of material 352 over some base structure (not shown). The base structure might include a semiconductor that, in some embodiments, may be comprised of silicon, e.g., monocrystalline silicon, that may be conductively doped, e.g., to have an n-type conductivity, such as an $N^+$ conductivity. Where the instances of material 352 are used to form control gates of memory cells of a NAND string, it is noted that fewer or more instances of material 352 may be formed depending upon the desired number of memory cells in each NAND string. It is further noted that the structure of FIG. 3A may depict instances of material 350 and material 352 used to form only a portion of one or more NAND strings. While the disclosure will be discussed with reference to forming memory cells of NAND strings, the compositions disclosed herein are suitable for formation of other structures, e.g., integrated circuit structures containing doped polysilicon.

The structure of FIG. 3A may then be patterned to form openings 354 through the instances of material 350 and the instances of material 352 as depicted in FIG. 3B. For example, a mask (not shown), e.g., imaging resist, such as photo-resist, may be formed over the structure of FIG. 3A and patterned to expose regions of the top instance of material 350, or some overlying material (not shown). The materials below the exposed regions may be subsequently removed, e.g., by isotropic etching, to form openings 354.

To form the structure of FIG. 3C, portions of material 350 are removed (e.g., recessed). The removal process utilizes a wet chemistry to anisotropically remove portions of material 350 selective to material 352, i.e., to remove material 350 at a faster rate than material 352 is removed, thereby recessing instances of material 350 relative to instances of material 352. Thus, to remove portions of material 350, the structure of FIG. 3B is exposed to an aqueous composition configured to etch material 350 selective to material 352. The exposure is generally for a period of time that is expected to remove a desired amount of the material 350. For example, it may be experimentally or empirically determined that a particular time is needed to recess material 350 by a particular amount. Ideally then, if the removal process is performed for the particular time, it would be expected that the instances of material 350 would be recessed by the particular amount and damage to surrounding instances of material 352 or other materials would be mitigated by not subjecting them to the removal process for an unnecessary amount of time. Various embodiments may perform the removal process at processing temperatures in the range of 20° C. to 90° C., and further embodiments may perform the removal process at ambient temperatures, e.g., near 25° C.

For the removal process, various embodiments expose the materials 350 and 352 to aqueous compositions containing nitric acid ($HNO_3$) and ammonium fluoride ($NH_4F$) in order to remove portions of polysilicon selective to surrounding oxide. Various further embodiments further include hydrofluoric acid (HF) and/or a poly-carboxylic acid, such as oxalic acid ($H_2C_2O_4$), in such compositions. Compositions for use in various embodiments may contain additional chemical components that do not materially affect the basic and novel properties of the solutions disclosed herein. Some examples may include dyes, lubricants, stabilizers, buffers, surfactants, thickening agents, preservatives and antimicrobial agents. Nitric acid is commonly available in a 70 wt % aqueous solution, ammonium fluoride is commonly available in a 40 wt % aqueous solution, hydrofluoric acid is commonly available in a 49 wt % aqueous solution, and oxalic acid is commonly available as an anhydrous or dehydrate solid.

Applicant has found that the water content of the aqueous compositions containing nitric acid and ammonium fluoride can be critical in the fabrication of NAND memory. As memory density has increased, material thicknesses has generally decreased. For example, the instances of material 350 and material 352, such as in a NAND string of the type depicted in FIG. 4, might be formed to be on the order of 30 nm thick using existing fabrication technology. Applicant has found that water levels as low as 39% wt % in aqueous solutions of nitric acid and ammonium fluoride can lead to delamination between polysilicon and oxide at such thicknesses. Delamination would generally lead to failure of such a NAND string.

Specifically, tests were conducted with aqueous compositions containing 500 parts by volume of nitric acid (70 wt %), 10 parts by volume of ammonium fluoride (40 wt %) and 100 parts by volume of distilled water, resulting in a composition containing 60.6 wt % nitric acid, 0.5 wt % ammonium fluoride and 38.9 wt % water; and 200 parts by volume of nitric acid (70 wt %), 10 parts by volume of ammonium fluoride (40 wt %) and 100 parts by volume of distilled water, resulting in a composition containing 50.5 wt % nitric acid, 1.1 wt % ammonium fluoride and 48.4 wt % water. In both tests, recessing boron-doped polysilicon in the presence of silicon oxide, such as in a structure of the type depicted in FIG. 3C, resulted in delamination of instances of the boron-doped polysilicon from instances of the silicon oxide. As such, Applicant believes that the water content of various embodiments of compositions described herein should be held to less than 39 wt %, and more preferably at less than or equal to 35 wt %, to mitigate such delamination between polysilicon and oxide materials in integrated circuit fabrication.

Applicant has further found that the addition of hydrofluoric acid to aqueous compositions described herein can increase the etch rate of the compositions for etching polysilicon, but can lead to excessive aggressiveness toward the top of a stack of materials being etched, such as in a structure of the type depicted in FIG. 3C. Adding oxalic acid or other poly-carboxylic acid to such compositions may tend to reduce this aggressiveness at the top of the stack.

For some embodiments, aqueous compositions for use in removing portions of material 350 might contain 65-70 wt % nitric acid, 0.06-0.60 wt % ammonium fluoride, 0.00-0.08 wt % hydrofluoric acid, 0.0-0.4 wt % poly-carboxylic acid, and 28.9-34.9 wt % water. For certain embodiments, aqueous compositions for use in removing portions of material 350 might contain 65-70 wt % nitric acid, 0.06-0.60 wt % ammonium fluoride, and 29.4-34.9 wt % water. For certain embodiments, aqueous compositions for use in removing portions of material 350 might contain 69 wt % nitric acid, 0.6 wt % ammonium fluoride, and 30.4 wt % water. For certain embodiments, aqueous compositions for use in removing portions of material 350 might contain 69 wt % nitric acid, 0.6 wt % ammonium fluoride, 0.4 wt % poly-carboxylic acid, and 30 wt % water.

Figure 4:
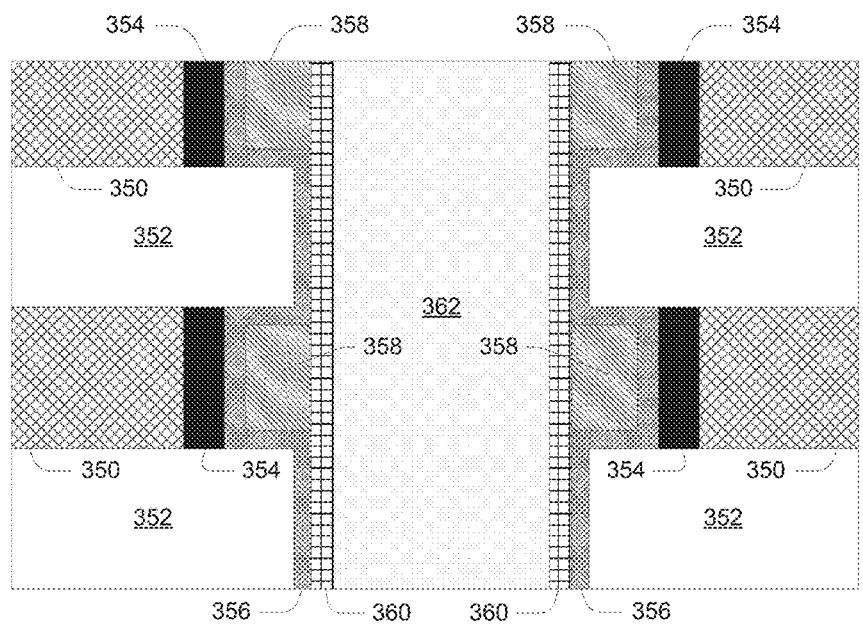
FIG. 4 is a cross-sectional view of a portion of a NAND string of memory cells, in accordance with an embodiment, formed from a structure of the type depicted in FIG. 3C.

A structure of the type depicted in FIG. 3C may be utilized to form a NAND string of memory cells. FIG. 4 is a cross-sectional view of a portion of a NAND string of memory cells, in accordance with an embodiment, formed from a structure of the type depicted in FIG. 3C, wherein material 350 is polysilicon and material 352 is an oxide. Forming a NAND string of memory cells from a structure of the type depicted in FIG. 3C can be performed in a variety of methods outside the scope of this disclosure, but one example might include forming a first dielectric 354 (e.g., forming a thermal oxide) over surfaces of material 350, forming a second dielectric 356 (e.g., by chemical vapor deposition) over surfaces of material 352 and first dielectric 354, forming data-storage structures 358 over surfaces of second dielectric 356 between instances of material 352, forming a third dielectric 360 over surfaces of data-storage structures 358 and second dielectric 356, and forming a semiconductor 362 over (e.g., between) surfaces of third dielectric 360. The third dielectric 360 might function as a gate dielectric. The data-storage structure 358 might function as a floating gate. The first dielectric 354 and the second dielectric 356 might collectively function as an intergate dielectric. The material 350 might function as a control gate. And the semiconductor 362 might function as a channel region. Additional fabrication, such as formation of source lines, select gates, data lines, etc., is well known in the art of integrated circuit fabrication and will not be described herein. The NAND string of FIG. 4 is provided simply to demonstrate how the structure described with reference to FIGS. 3A-3C might be used in the formation of a memory device. Note that where the data-storage structures 358 are dielectric data-storage structures, one or more of the dielectrics 354, 356 and 360 might be eliminated.

Figure 5A:
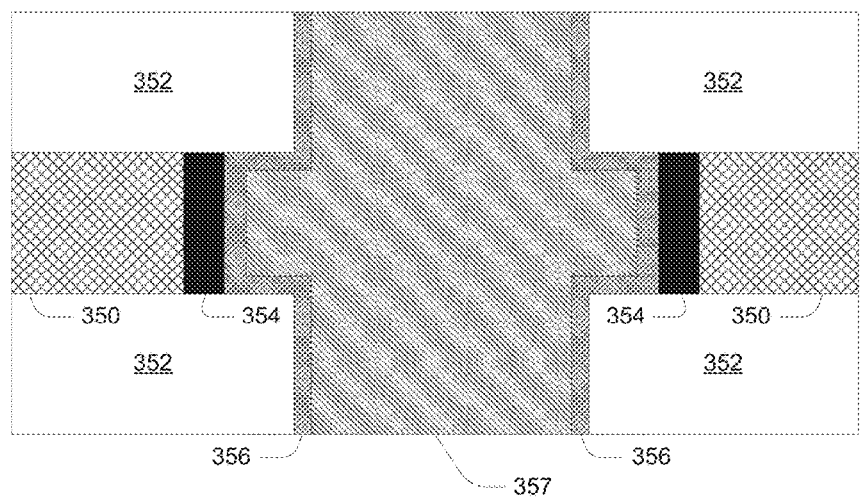
FIGS. 5A-5C are cross-sectional views of a portion of an integrated circuit device during various stages of fabrication in accordance with an embodiment.
Figure 5B:
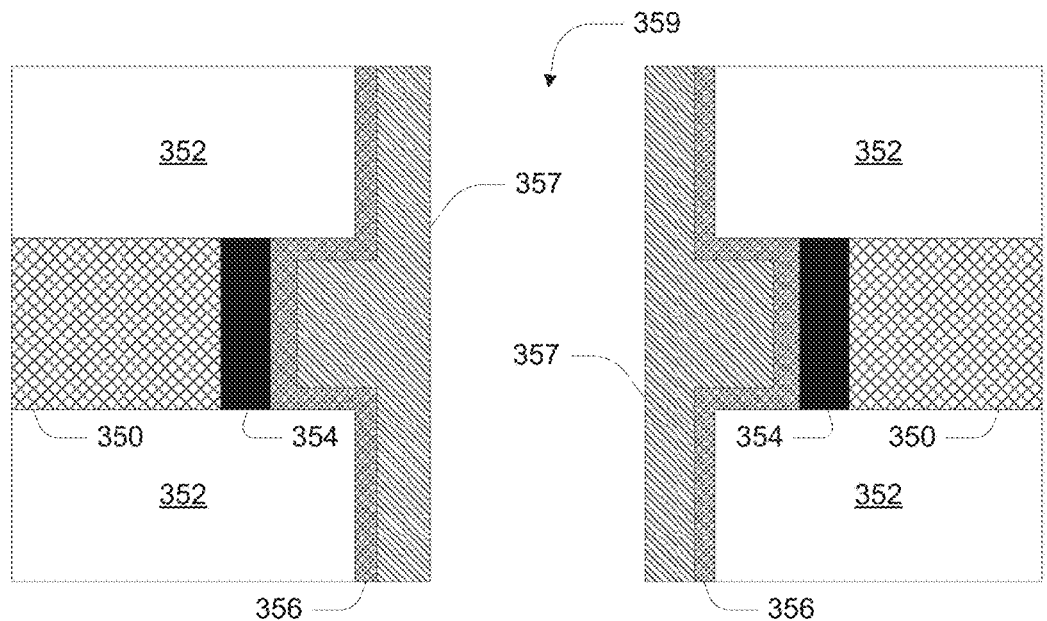
Figure 5C:
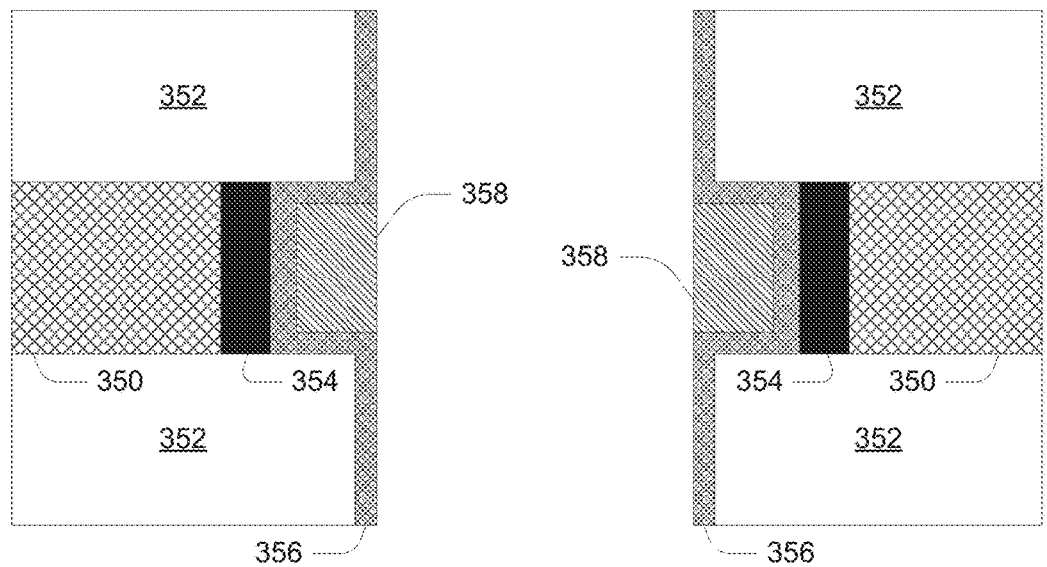

Further note that where the data-storage structures 358 of FIG. 4 contain polysilicon, data-storage structures 358 might be formed by forming polysilicon on surfaces of second dielectric 356, followed by removing portions of that polysilicon in a process similar to that described with respect to FIG. 3C. For example, FIGS. 5A-5C are cross-sectional views of a portion of an integrated circuit device during various stages of fabrication. FIGS. 5A-5C demonstrate how polysilicon floating gates might be formed for use as data-storage structures 358. In FIG. 5A, after formation of the second dielectric 356, a polysilicon 357 is formed over surfaces of the second dielectric 356. For various embodiments, the polysilicon 357 is formed to fill the void between surfaces of the second dielectric 356, such as depicted in FIG. 5A. As one example, polysilicon may be formed by chemical vapor deposition. Polysilicon floating gates are generally conductively doped, e.g., having an n-type or p-type conductivity. For example, the polysilicon 357 may be a boron-doped polysilicon having a p-type conductivity.

Following formation of the polysilicon 357, portions of the polysilicon 357 are removed. The removal process may begin as depicted in FIG. 5B, by forming an opening 359 in the polysilicon 357, and continue until sufficient polysilicon 357 is removed to form discrete data-storage structures 358, such as depicted in FIG. 5C. For various embodiments, such removal may be accomplished by exposing the polysilicon 357 to an aqueous composition containing nitric acid and ammonium fluoride in order to remove portions of polysilicon 357. Various further embodiments further include hydrofluoric acid and/or a poly-carboxylic acid, such as oxalic acid, in such compositions. Compositions for use in various embodiments may contain additional chemical components that do not materially affect the basic and novel properties of the solutions disclosed herein. Some examples may include dyes, lubricants, stabilizers, buffers, surfactants, thickening agents, preservatives and antimicrobial agents. The polysilicon 357 may be exposed to the aqueous composition containing nitric acid and ammonium fluoride for a period of time that is expected to remove sufficient portions of polysilicon 357 to leave those portions forming data-storage structures 358 adjacent surfaces of intergate dielectric 356 and between instances of material 352 as depicted in FIG. 5C.

FIGS. 6A and 6B are SEM pictures of cross-sectional views of structures of the type depicted in FIG. 3C. FIG. 6A depicts a structure formed using a prior-art method using a vapor phase chemistry to recess polysilicon in the presence of oxide, while FIG. 6B depicts a structure formed using a method in accordance with an embodiment to recess polysilicon in the presence of oxide. As can be seen in comparison of FIGS. 6A and 6B, the sections 670 of polysilicon of FIG. 6A exhibit protrusions or "nubs" while the sections 670 of polysilicon of FIG. 6B exhibit a smoother appearance. The nubs in the structure of FIG. 6A would typically be smoothed away using a second cleaning process. As such, embodiments as described herein may eliminate a subsequent cleaning process over methods of the prior art.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method, comprising:
   forming a first instance of oxide;
   forming an instance of polysilicon over the instance of oxide;
   forming a second instance of oxide over the instance of polysilicon;
   forming an opening through the second instance of oxide, the instance of polysilicon and the first instance of oxide;
   exposing the second instance of oxide, the instance of polysilicon and the first instance of oxide to an aqueous composition; and
   using the aqueous composition, recessing the instance of polysilicon relative to the first instance of oxide and the second instance of oxide within the opening;
   wherein the aqueous composition comprises nitric acid, poly-carboxylic acid and ammonium fluoride.

2. The method of claim 1, further comprising using the aqueous composition comprising a water content of less than or equal to 39 wt %.

3. The method of claim 2, further comprising using the aqueous composition comprising a water content of less than or equal to 35 wt %.

4. The method of claim 1, further comprising using the aqueous composition comprising 65-70 wt % nitric acid, 0.06-0.6 wt % ammonium fluoride, and poly-carboxylic acid at 0.4 wt % or less.

5. The method of claim 4, further comprising using the aqueous composition, wherein the poly-carboxylic acid is oxalic acid.

6. The method of claim 4, further comprising using the aqueous composition further comprising hydrofluoric acid.

7. The method of claim 6, further comprising using the aqueous composition comprising hydrofluoric acid at 0.08 wt % or less.

8. The method of claim 7, further comprising using the aqueous composition, wherein the poly-carboxylic acid is oxalic acid.

9. The method of claim 1, wherein forming the instance of polysilicon comprises forming an instance of boron-doped polysilicon.

10. The method of claim 9, wherein forming the second instance of oxide comprises forming an instance of a silicon oxide or a silicon oxynitride.

* * * * *